(12) United States Patent
Stiasny

(10) Patent No.: US 9,698,067 B2
(45) Date of Patent: Jul. 4, 2017

(54) SPACER SYSTEM FOR A SEMICONDUCTOR SWITCHING DEVICE

(71) Applicant: ABB Schweiz AG, Baden (CH)

(72) Inventor: Thomas Stiasny, Wädenswil (CH)

(73) Assignee: ABB Schweiz AG, Baden (CH)

( * ) Notice: Subject to any disclaimer, the term of this patent is extended or adjusted under 35 U.S.C. 154(b) by 0 days.

(21) Appl. No.: 14/940,635

(22) Filed: Nov. 13, 2015

(65) Prior Publication Data

US 2016/0071815 A1   Mar. 10, 2016

Related U.S. Application Data

(63) Continuation of application No. PCT/EP2014/059256, filed on May 6, 2014.

(30) Foreign Application Priority Data

May 13, 2013   (EP) .................................... 13167468

(51) Int. Cl.
*H01L 23/051* (2006.01)
*H01L 23/32* (2006.01)
(Continued)

(52) U.S. Cl.
CPC ............ *H01L 23/051* (2013.01); *H01L 23/32* (2013.01); *H01L 24/72* (2013.01); *H01L 24/90* (2013.01);
(Continued)

(58) Field of Classification Search
CPC ..... H01L 23/02; H01L 23/043; H01L 23/045; H01L 23/047; H01L 23/051; H01L 23/32
See application file for complete search history.

(56) References Cited

U.S. PATENT DOCUMENTS 3,280,389 A   10/1966   Heinz
3,872,630 A    3/1975   Ali
(Continued)

FOREIGN PATENT DOCUMENTS

CH           628461 B1    2/1982
DE         19505387 A1    8/1996
(Continued)

OTHER PUBLICATIONS

IPRP & Written Opinion of the International Searching Authority Application No. PCT/EP2014/059256 Issued: Nov. 17, 2015 8 pages.
(Continued)

*Primary Examiner* — Eduardo A Rodela
(74) *Attorney, Agent, or Firm* — Whitmyer IP Group LLC

(57) ABSTRACT

A spacer system for a semiconductor switching device which is formed as a spacer ring and a plurality of insulating elements and supporting elements are arranged in an alternating manner around a circumference of the spacer ring. The insulating element includes a recess receiving a cathode gate connector element. The supporting element includes a projection receiving a spring system for clamping while assembling the switching device. The switching device includes a substrate, a cathode pole piece, an anode pole piece, strain buffer plates and a gate ring. Further connector elements, are electrically connecting the cathode pole piece and the gate ring of the semiconductor switching device to an external circuit unit. The space between the connector elements is minimized in order to reduce the gate circuit impedance, thus enabling an increased maximum turn-off current and further allowing for the use of larger semiconductor switching devices for high power applications.

22 Claims, 3 Drawing Sheets

(51) Int. Cl.
*H01L 23/00* (2006.01)
*H01L 23/544* (2006.01)

(52) U.S. Cl.
CPC .. *H01L 23/544* (2013.01); *H01L 2223/54426* (2013.01); *H01L 2924/1301* (2013.01); *H01L 2924/1305* (2013.01); *H01L 2924/13022* (2013.01); *H01L 2924/13055* (2013.01)

(56) References Cited

U.S. PATENT DOCUMENTS

| | | | |
|---|---|---|---|
| 6,166,402 A | 12/2000 | Kodani et al. | |
| 6,423,988 B1 | 7/2002 | Sato | |
| 8,786,107 B2 * | 7/2014 | Orimoto | H01L 23/045 257/688 |
| 2002/0105008 A1 | 8/2002 | Taguchi | |
| 2013/0062749 A1 * | 3/2013 | Imai | H01L 24/72 257/690 |
| 2016/0079134 A1 * | 3/2016 | Miyake | H01L 23/08 257/702 |

FOREIGN PATENT DOCUMENTS

| | | |
|---|---|---|
| EP | 0567996 A1 | 11/1993 |
| EP | 0687014 A2 | 12/1995 |
| EP | 0687014 A3 | 5/1996 |
| EP | 0746021 A2 | 12/1996 |
| EP | 0746021 A3 | 12/1996 |
| EP | 1220314 A2 | 7/2002 |
| EP | 1220314 A3 | 3/2005 |
| GB | 1336790 A | 11/1973 |
| JP | 63124535 A | 5/1988 |
| JP | 10270675 A | 10/1998 |
| JP | 1167797 A | 3/1999 |
| JP | 2002299354 A | 10/2002 |

OTHER PUBLICATIONS

B&P Lamp Supply, Inc.: "Bakelite (plastic) Cord Bushing, Tap 1/8F." May 10, 2013. Sep. 25, 2013 <http://web.archive.org/web/20130510075301/http://www.bplanpsupply.com/product/1930_bakelite-plastic-cord-bushing-tap-18f>.
European Search Report Application No. EP13 16 7468 Completed: Sep. 30, 2013; Mailing Date: Jan. 27, 2014 22 pages.
European Search Report Application No. EP 13 16 7468 Completed: Sep. 30, 2013; Mailing Date: Oct. 8, 2013 19 pages.
International Search Report Application No. PCT/EP2014/059256 Completed: Sep. 28, 2014; Mailing Date: Oct. 7, 2014 4 pages.
Jacks Small Engines: "Murray Bearings & Bushings." May 9, 2013. Sep. 25, 2013. <http://web.archive.org/web/20130509195210/http://www.jackssmallengines.com/Products/MURRAY/Bearings-Bushings>.

* cited by examiner

SPACER SYSTEM FOR A SEMICONDUCTOR SWITCHING DEVICE

FIELD OF THE INVENTION

The invention relates to the field of power electronics, in particular to a spacer system for connector elements of a semiconductor switching device.

BACKGROUND OF THE INVENTION

Semiconductor switching devices are powerful and fast turnoff components having a cathode-anode-gate structure. Specifically, the semiconductor switching device comprises a substrate having deposited thereon a cathode, an anode, and a gate of the switching device. The device further comprises connection means for electrically connecting the cathode, the anode and the gate of the switching device to an external circuit unit.

A semiconductor switching device has to handle large currents and voltages. One example of such a semiconductor switching device is an integrated gate commutated thyristor (IGCT). An IGCT is a gate-controlled turn-off switch which turns off like an insulated gate bipolar transistor (IGBT), but conducts like a thyristor with the lowest conductor losses. An integrated gate commutated thyristor is a power switching device for demanding high power applications such as, e.g. medium voltage drives, traction, wind power converters, AC excitation systems, battery energy storage systems, solid state breakers, traction line boosters, traction power compensators and induction heating.

A semiconductor switching device constructed as an IGCT nowadays is used in a variety of applications due to its versatility, efficiency and cost effectiveness. A conventional IGCT device has a ring-shaped structure where on a cathode disc a gate disc is arranged providing a gate connection to the switching device. An anode phase is arranged on top of a housing having for instance a specific creepage distance at the outside.

For operation of an IGCT for instance a maximum turn-off current has to be commutated via a gate-cathode connection to a gate unit during turn-off. The maximal allowable time interval for current commutation is given by the vertical and segment structure of the device and in principle it does not scale with the size of a wafer the device is formed on. However, the desired maximum turn off current depends strongly on said size of the wafer and is significantly reduced with increasing size. Thus, with the need of larger devices for high power applications there is also the need to increase the maximum turn off current.

In order to achieve a high turn off current a gate voltage may be increased. However, with increasing the voltage additional losses at the gate unit occur. Thus, increasing the gate voltage is not feasible in most circumstances. At a given gate voltage, however, the maximum turn off current is inversely proportional to a gate circuit impedance or in other words the lower the gate circuit impedance is the higher is the achievable maximum turn off current. Thus, reducing the impedance is one way to achieve higher maximum turn off currents.

In addition, it is important to be able to mount the semiconductor switching device easily in the housing. Furthermore, proper alignment and support of all parts inside a housing is important to guarantee proper contacting even after transport.

EP 1 220 314 A2 shows a prior art pressure contact for a thyristor module. Two ring pieces surrounding the thyristor latch in each other by having protrusions and recesses. To the lateral sides, the ring system is insulated by an insulation element. On the top side, an electrical main connector leads upwards. Each thyristor element is fixed to the base plate by screws arranged around each ring system. To the bottom side, a plurality of such thyristors are separately insulated from a base plate. The thyristors are arranged laterally from each, electrically connected to each other by a common main electrode plate, i.e. no compact arrangement is possible and the thyristors cannot be arranged in stack configuration. As all thyristors have to be directly mounted on the common base plate together, no modular design is possible.

EP 0 687 014 A2 shows a single light trigger thyristor element, which is pressed with its main electrodes to a substrate by a centrally arranged spring, which spring also presses a light guide to a central portion of the thyristor.

U.S. Pat. No. 3,280,389 A shows a rectifier stack, in which a spring is inserted between two pressure pieces, all of which are fully integrated in the main electrode path of the stack. The thyristors in the stack are pressed in their central part.

SUMMARY OF THE INVENTION

It is therefore an objective of the invention to reduce a gate circuit impedance and further allow proper alignment and support of the parts inside a housing of a semiconductor switching device. This objective is achieved by a spacer system and a semiconductor switching device according to the invention.

According to the invention, a spacer system, i.e. a spacer unit or a spacer device, for a semiconductor switching device comprises an insulating element or insulating area and a supporting element or supporting area. The insulating element further comprises a recess or a runner receiving a gate connector element, i.e. wire or leads or in other words connection means. The supporting element comprises a projection receiving a spring system for clamping the semiconductor switching device while assembling the device.

In a preferred variant of the invention, the gate connector element is guided by the insulating element below the spring system or in other words the connector element runs in pre-grooved sections of the insulating element below the spring system. The gate connector element is pressed between the insulating element and the spring system. In an exemplary embodiment of the invention, the spacer system is formed as a spacer ring for a semiconductor switching device and a plurality of insulating and supporting elements are arranged in an alternating manner, i.e. pattern or arrangement, around a circumference or periphery of the spacer ring.

In a further embodiment, a section of the gate connector element bridges, e.g. stretches, spans or covers the height difference during clamping of the switching device for assembling the device.

In yet another embodiment, the spacer system is formed as a spacer ring, received by a pole piece or element of the semiconductor switching device, and is smaller in diameter than the pole piece or may be formed as a spring element, e.g as a split washer or split-ring washer which is a ring split at one section in order to be able to enlarge its diameter.

In a further variant of the invention, the spacer system comprises an alignment or centering element for the spring system, a support element for a gate ring, and/or an alignment and/or clamping element of a cathode strain buffer plate.

In an advantageous embodiment of the invention, the spring system is comprised of Belleville springs also known as Belleville washers, coned-disc springs, conical spring washers, disc springs, or cupped spring washers or comprised of wavelike or sinuous springs.

In a further embodiment of the invention, the recess and the projection are formed integrally, i.e. in one piece, or separately, i.e. in two pieces, and are comprised of glimmer, polymer, dielectric, ceramic material or a compound material.

In another exemplary embodiment the insulating element has a thickness of less than 500 μm generally depending on the material, but as thin as possible to insulate the applied voltage and further the supporting element has a thickness of more than 1 mm to allow movement of springs and passing through of the connector element.

The present invention also relates to a semiconductor switching device, comprising a substrate, a cathode disc, an anode, pole pieces and a gate ring, wherein connector elements are electrically connecting the cathode and the gate of the semiconductor switching device to an external circuit unit. The semiconductor switching device is further comprising a spacer system comprising an insulating and a supporting element, wherein the insulating element is formed as a recess receiving a gate connector element and the supporting element is formed as projection receiving a spring system. The gate connector element is guided by the insulating element below or underneath the spring system and the gate connector element is pressed between the insulating element and the spring system.

In a further embodiment of the semiconductor switching device, the spacer unit is formed as a spacer ring and a plurality of insulating and supporting elements are arranged in an alternating pattern around a circumference of the spacer ring and wherein a section of the gate connector element is bent during clamping of the switching device while assembling the device.

In another embodiment the semiconductor switching device is an integrated gate commutated thyristor.

In yet another embodiment of the semiconductor switching device, the housing is made of an insulating material or a ceramic material.

In an exemplary embodiment of the semiconductor switching device, the cathode pole piece comprises a cathode strain buffer plate and wherein the anode pole piece comprises an anode strain buffer plate, wherein a housing flange is aligned to the cathode pole piece and an anode flange is aligned to the anode pole piece, and wherein in particular the housing comprises at least one creepage section at the outside thereof in order to deviate creepage currents from the anode to the gate connector.

In a further embodiment of the semiconductor switching device, the substrate and the pole pieces are affixed by an alignment pin or ring or wherein the pole pieces are affixed by an alignment pin or ring and the substrate is affixed by an edge rubber and wherein further the cathode strain buffer plate has a thickness lower than a thickness of the anode strain buffer plate and the cathode strain buffer plate is formed as a cup, i.e. comprising a bottom and for instance a circular side attached to the bottom, with an opening of the cup facing the cathode pole piece and the cup receiving the cathode pole piece, i.e. the sides of the cup enclose the cathode pole piece at least partially so the cathode pole piece is affixed or held in place by the cathode strain buffer plate.

This way the invention allows to reduce the gate circuit impedance, thus enabling an increased maximum turn-off current and further allowing the use of larger semiconductor switching devices for high power applications.

BRIEF DESCRIPTION OF THE DRAWINGS

The subject matter of the invention will be explained in more detail in the following text with reference to preferred exemplary embodiments which are illustrated in the attached drawings, in which.

The reference symbols used in the drawings, and their meanings, are listed in summary form in the list of designations. In principle, identical parts are provided with the same reference symbols in the figures.

DETAILED DESCRIPTION OF THE INVENTION

Figure 1:
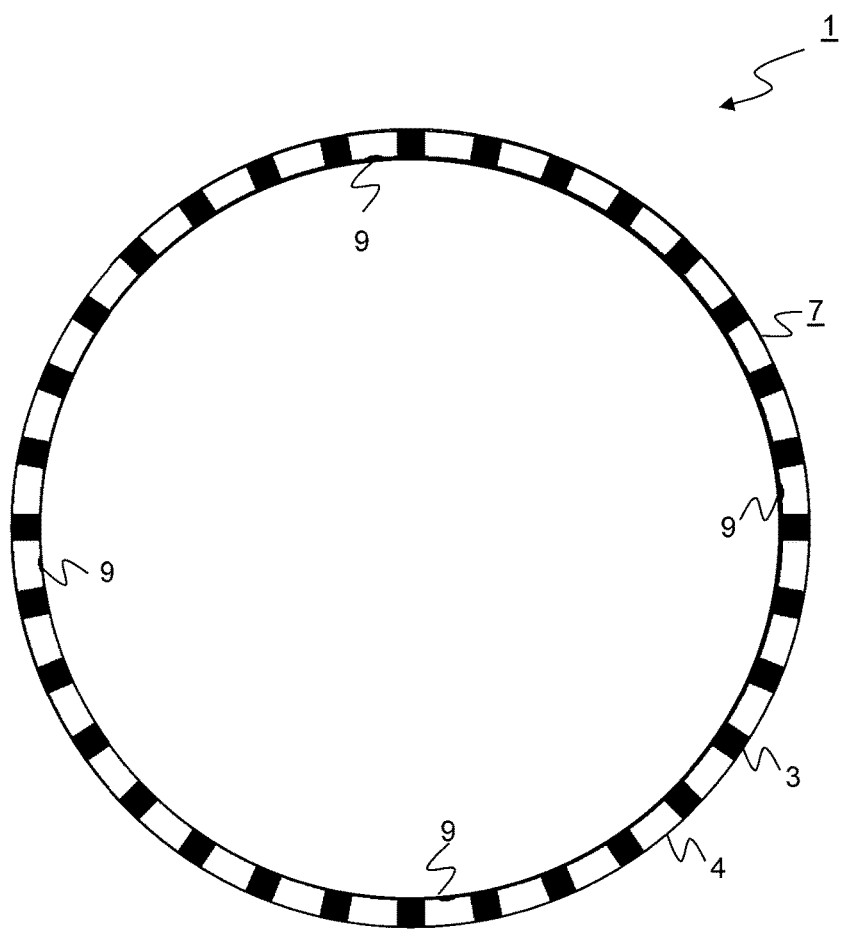
FIG. 1 shows a spacer system formed as a spacer ring with insulating elements and supporting elements.

FIG. 1 shows a spacer system 1 for a semiconductor switching device 2 comprising an insulating element 3 and a supporting element 4. The insulating element 3 comprises a recess receiving a gate connector element 5. The supporting element 4 comprises a projection receiving a spring system 6 for clamping while assembling the semiconductor switching device 2.

The spacer system 1 shown in FIG. 1 is formed as a spacer ring 7 for a large area, i.e. with a diameter of 60 mm or larger, semiconductor switching device 2 and a plurality of insulating and supporting elements 3, 4 are arranged in an alternating manner around a circumference of the spacer ring. The gate connector element 5 is guided by the insulating element 3 below the spring system 6 resting on the projections of the supporting element 4. The gate connector element 5 is pressed between the insulating element 3 and the spring system 6. The recesses and the projections may be formed integrally or separately and are comprised of glimmer, polymer, dielectric, ceramic material or a compound material. The insulating element 3 has a thickness of less than 500 μm generally depending on the material, but may be as thin as possible to insulate the applied voltage, and further the supporting element 4 has a thickness of more than 1 mm to allow movement of springs and passing through of the connector element below the spring system 6. The spacer system comprises further an alignment element 9 for the spring system 6, a support element 10 for a gate ring 11, and an alignment element 12 of a cathode strain buffer plate 13. To exactly fit with tolerances of dimensions, i.e. diameter, of the cathode pole piece 13 the spacer system 1 may be formed with a reduced diameter and may be cut at one section to allow bending of the spacer ring 7 to widen its diameter.

The spacer system 1 serves several functions in the semiconductor switching device 2. For instance, the spacer system 1 insulates gate and cathode potential, supports a gate spring construction which needs to withstand a spring pressure at all conditions of operation, guides connector elements 5 below the spring system 6, supports the gate ring 11, allows alignment of the spring system 6, and allows alignment and clamping of pole pieces 13, 14.

Figure 2:
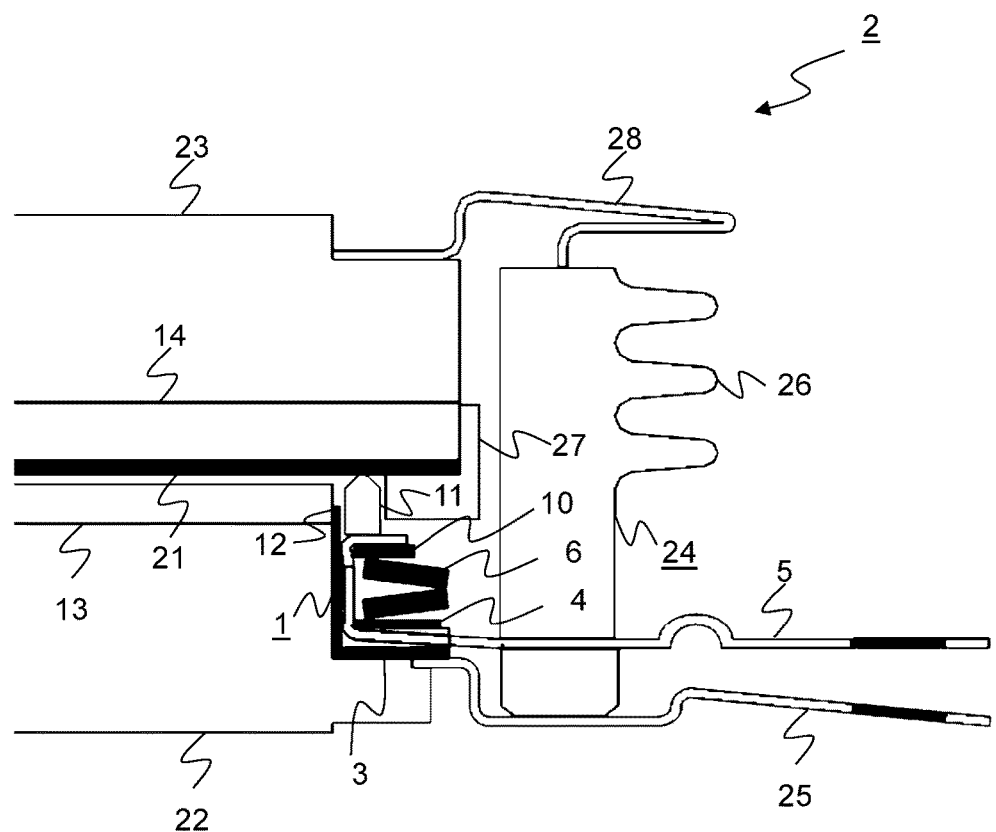
FIG. 2 schematically shows a semiconductor switching device with a spacer system with insulating elements and supporting elements before clamping.

FIG. 2 schematically shows the semiconductor switching device 2 with a spacer system 1 with insulating elements 3 and supporting elements 4 before clamping of the switching device 2. The device design is an outer ring gate construction. The switching device 2 comprises further a substrate 21, a cathode pole piece 22, an anode pole piece 23, strain buffer plates 13, 14 and a gate ring 11. The spring system may also press the gate connector element to the gate ring and thereby, achieve a reliable connection between gate ring and gate connector.

Further connector elements 5, 25 are electrically connecting the cathode pole piece 22 and the gate ring 11 of the switching device 2 to an external circuit unit allowing easy mounting of device parts.

In principle, the space between the connector elements 5, 25 is to be minimized in order to reduce a gate circuit impedance. Therefore, inside the switching device 2 cathode and gate potential is guided as close as possible near each other. This is realized by running the connector elements 5, 25 below the spring system 6. The insulating distance is ensured by the insulating element 3. To avoid cold work hardening of the leads by movement of the gate system and spring travel during clamping and unclamping of the switching device 2, the longest section of the connector element 5 is chosen to bridge a gap caused by the spring system 6. However, minimizing the distance of the connector elements 5, 25 is only limited by the mechanical and structural requirements of a housing 24. Thus, the distance between the connector elements 5 and 25 is due to guarantee a stable housing 24 withstanding high mechanical load.

The cathode pole piece 22 comprises the cathode strain buffer plate 13 and the anode pole piece 23 comprises the anode strain buffer plate 14. An anode flange 28 is provided for connecting the housing isolation tube 24 with the anode pole piece 23. The housing isolation tube 24 comprises creepage sections 26 at the outside thereof in order to deviate creepage currents from the anode 23 to the gate connector 5 and wherein further a housing flange is aligned to the cathode pole piece 22 and an anode flange is aligned to the anode pole piece 23.

The substrate 21 and the strain buffer plates 13, 14 are affixed by an alignment pin or ring 27 or wherein the strain buffer plates 13, 14 are affixed by an alignment pin or ring and the substrate 21 is affixed by an edge rubber 27. Further the cathode strain buffer plate 13 has a thickness lower than a thickness of the anode strain buffer plate 14 and the cathode strain buffer plate 13 is formed as a cup with an opening of the cup facing the cathode pole piece and the cup receiving the cathode pole piece 22.

For mounting the switching device 2 gate connector elements 5 inside the housing 24 are pre-grooved or pre-bent to ensure proper mounting. Subsequently, the spacer system 1 is inserted in the housing 24 and oriented with the recesses of the insulating elements 3 to the gate connector elements 5. The gate connector elements 5 are then bent down into the recesses. The pre-grooving of the gate connector elements 5 ensures exact bending. In a next step the spring system 6 is inserted in the housing 24. A pressure spreader ring of the spring system 6 is aligned with recesses by alignment elements 9. The gate connector element 5 is then bent over the spring system 6. The gate ring 11 is placed inside the housing 24. Further the cathode strain buffer 13, the substrate 21, anode strain buffer plate 14 the anode pole piece 23, respective pole pieces 13, 14 and Finally, the housing 24 may be closed.

Figure 3:
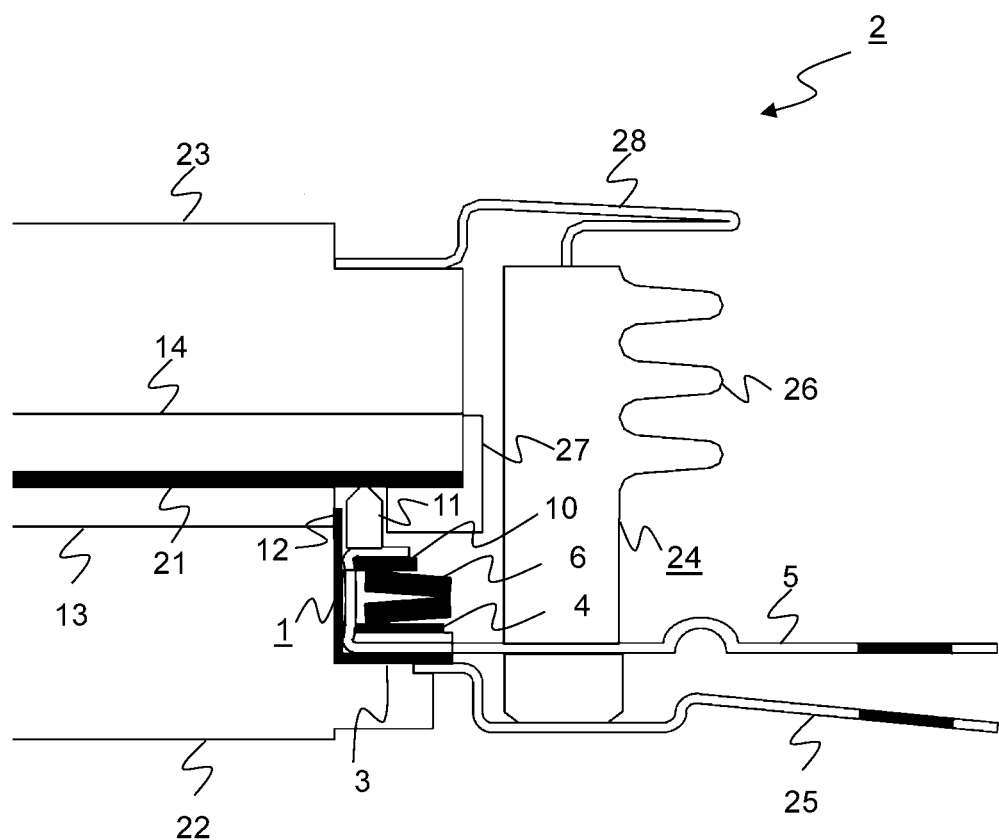
FIG. 3 schematically shows a semiconductor switching device with a spacer system with insulating elements and supporting elements after clamping.

FIG. 3 shows the switching device 2 after clamping and the final shape of the connector element 5 is formed. The vertical part of the connector element 5 is bent towards the spring system 6.

What is claimed is:

1. A spacer system for a semiconductor switching device comprising a plurality of insulating elements and a plurality of supporting elements, wherein the spacer system is formed as a spacer ring and the plurality of insulating elements and the plurality of supporting elements are arranged in an alternating manner around a circumference of the spacer ring and
wherein at least one of the plurality of insulating elements comprises a recess receiving a gate connector element and at least one of the plurality of supporting elements comprises a projection receiving a spring system for clamping while assembling the semiconductor switching device.

2. The spacer system according to claim 1, wherein the gate connector element is guided by the at least one of the plurality of insulating elements below the spring system and wherein the gate connector element is pressed between the at least one of the plurality of insulating elements and the spring system.

3. The spacer system according to claim 2, wherein a section of the gate connector element bridges a height difference during clamping of the switching device for assembling the device.

4. The spacer system according to claim 2, wherein the spacer system is received by a cathode strain buffer plate of the semiconductor switching device and is smaller in diameter than the cathode strain buffer plate or formed as a spring element.

5. The spacer system according to claim 2, further comprising at least one of an alignment element for the spring system, a support element for a gate ring, and an alignment element of a cathode strain buffer plate.

6. The spacer system according to claim 1, wherein a section of the gate connector element bridges a height difference during clamping of the switching device for assembling the device.

7. The spacer system according to claim 1, wherein the spacer system is received by a cathode strain buffer plate of the semiconductor switching device and is smaller in diameter than a cathode strain buffer plate or formed as a spring element.

8. The spacer system according to claim 1, further comprising at least one of an alignment element for the spring system, a support element for a gate ring, and an alignment element of a cathode strain buffer plate.

9. The spacer system according to claim 1, wherein the spring system is comprised of Belleville springs or of wavelike springs.

10. The spacer system according to claim 1, wherein the recess and the projection are formed integrally or separately and are comprised of glimmer, polymer, dielectric, ceramic material or a compound material.

11. The spacer system according to claim 1, wherein at least one of the plurality of insulating elements has a thickness of less than 500 µm and at least one of the plurality of supporting elements has a thickness of more than 1 mm.

12. A semiconductor switching device, comprising a substrate, a cathode pole piece, an anode pole piece, strain buffer plates and a gate ring, wherein connector elements are electrically connecting the cathode pole piece and the gate ring of the semiconductor switching device to an external circuit unit, the semiconductor switching device further comprising a spacer system comprising a plurality of insulating elements and a plurality of supporting elements, wherein the spacer system is formed as a spacer ring and the plurality of insulating elements and the plurality of supporting elements are arranged in an alternating pattern around a circumference of the spacer ring and wherein a section of a gate connector element is bent during clamping of the switching device while assembling the device and wherein at least one of the plurality of insulating elements comprises a recess receiving the gate connector element and at least one of the plurality of supporting elements comprises a projection receiving a spring system and wherein the gate connector element is guided by the at least one of the plurality of insulating elements below the spring system.

13. The semiconductor switching device according to claim 12, wherein the semiconductor switching device is a gate commutated thyristor.

14. The semiconductor switching device according to claim 12, further comprising a housing tube made of an insulating material or a ceramic material.

15. The semiconductor switching device according to claim 12, wherein the cathode pole piece comprises a cathode strain buffer plate and wherein the anode pole piece comprises an anode strain buffer plate, wherein a housing flange is aligned to the cathode pole piece and an anode flange is aligned to the anode pole piece, and wherein in particular a housing comprises at least one creepage section at the outside thereof in order to deviate creepage currents from the anode to the gate connector.

16. The semiconductor switching device according to claim 15, wherein the substrate and the strain buffer plates are affixed by an alignment pin or ring or wherein the strain buffer plates are affixed by an alignment pin or ring and the substrate is affixed by an edge rubber and wherein further the cathode strain buffer plate has a thickness lower than a thickness of the anode strain buffer plate and the cathode strain buffer plate is formed as a cup with an opening of the cup facing the cathode pole piece and the cup receiving the cathode pole piece.

17. The semiconductor switching device according to claim 12, wherein the substrate and the strain buffer plates are affixed by an alignment pin or ring or wherein the strain buffer plates are affixed by an alignment pin or ring and the substrate is affixed by an edge rubber and wherein further the cathode strain buffer plate has a thickness lower than a thickness of the anode strain buffer plate and the cathode strain buffer plate is formed as a cup with an opening of the cup facing the cathode pole piece and the cup receiving the cathode pole piece.

18. The semiconductor switching device according to claim 12, wherein the gate connector element is guided by the at least one of the plurality of insulating elements below the spring system and wherein the gate connector element is pressed between the at least one of the plurality of insulating elements and the spring system.

19. The semiconductor switching device according to claim 18, wherein the semiconductor switching device is a gate commutated thyristor.

20. The semiconductor switching device according to claim 18, wherein a housing tube is made of an insulating material or a ceramic material.

21. The semiconductor switching device according to claim 18, wherein the cathode pole piece comprises a cathode strain buffer plate and wherein the anode pole piece comprises an anode strain buffer plate, wherein a housing flange is aligned to the cathode pole piece and an anode flange is aligned to the anode pole piece, and wherein in particular a housing comprises at least one creepage section at the outside thereof in order to deviate creepage currents from the anode to the gate connector.

22. The semiconductor switching device according to claim 18, wherein the substrate and the strain buffer plates are affixed by an alignment pin or ring or wherein the strain buffer plates are affixed by an alignment pin or ring and the substrate is affixed by an edge rubber and wherein further the cathode strain buffer plate has a thickness lower than a thickness of the anode strain buffer plate and the cathode strain buffer plate is formed as a cup with an opening of the cup facing the cathode pole piece and the cup receiving the cathode pole piece.

* * * * *